United States Patent
Behm et al.

(10) Patent No.: US 7,860,700 B2
(45) Date of Patent: Dec. 28, 2010

(54) HARDWARE VERIFICATION BATCH COMPUTING FARM SIMULATOR

(75) Inventors: Michael L. Behm, Cedar Park, TX (US);
Steven R. Farago, Austin, TX (US);
Bryan R. Hunt, Austin, TX (US);
Stephen McCants, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 546 days.

(21) Appl. No.: 11/836,222

(22) Filed: Aug. 9, 2007

(65) Prior Publication Data

US 2009/0043559 A1    Feb. 12, 2009

(51) Int. Cl.
G06F 17/50 (2006.01)
(52) U.S. Cl. .................................................. 703/14
(58) Field of Classification Search .................. 703/14
See application file for complete search history.

(56) References Cited

U.S. PATENT DOCUMENTS 7,178,063 B1 *   2/2007   Smith ......................... 714/38

OTHER PUBLICATIONS

Hisashi Kobayashi, "Modeling and Analysis An Introduction to System Performance Evaluation Methodology", 1978, Addison-Wesley, pp. 96-100, 116-117, 221-283.*

Zheng Li et al., "Search Algorithms for Regression Test Case Prioritization", Apr. 2007, IEEE Transactions on Software Engineering, vol. 33, No. 4, pp. 225-237.*

Sebastian Elbaum et al., "Test Case Prioritization: A Family of Empirical Studies", 2002, IEEE Transactions on Software Engineering, vol. 28, No. 2, pp. 159-182.*

Hyunsook Do et al., "Empirical Studies of Test Case Prioritization in a JUnit Testing Environment", 2004, Proceedings of the 15th International Symposium on Software Reliability Engineering, 12 unnumbered pages.*

Jung-Min Kim et al., "A History-Based Test Prioritization Technique for Regression Testing in Resource Constrained Environments", 2002, Proceedings of the 24th International Conference on Software Engineering, pp. 119-129.*

Amir Nahir et al., "Scheduling-based Test-case Generation for Verification of Multimedia SoCs", 2006, Design Automation Conference, pp. 348-351.*

Paolo Tonella et al., "Using the Case-Based Ranking Methodology for Test Case Prioritization", 2006, IEEE International Conference on Software Maintenance 2006, ten unnumbered pages.*

* cited by examiner

*Primary Examiner*—Paul L Rodriguez
*Assistant Examiner*—Russ Guill
(74) *Attorney, Agent, or Firm*—Yee & Associates, P.C.; Matthew W. Baca

(57) ABSTRACT

The exemplary embodiments provide a computer implemented method, apparatus, and computer usable program code for calculating the expected behavior of a group of hardware verification test cases. Batch simulation parameters are configured. A test case is submitted for evaluation. Historical performance data for test cases associated with the submitted test case is gathered. A set of performance statistics for the submitted test case is generated based on the historical performance data and the configured batch simulation parameters. A set of values for the submitted test is generated based on the generated performance statistics for the submitted test case and the historical performance data. The generated set of values and the generated set of performance statistics for the submitted test case are displayed to a user.

9 Claims, 3 Drawing Sheets

BatchSimulation Algorithm:
Set SimulatedTime to 0:

Repeat
{
For all empty job slots | {
    Randomly select a testcase T based on weight distribution over all testcases.
    Assign testcase T to job slot |. The test is considered "running". Set RemainingTime(|) to AvgDuration(T)
}

Select jobslot MinJobSlot such that RemainingTime(MinJobSlot) is a minimum.
Advance SimulatedTime by RemainingTime(MinJobSlot)
For all job slots | {
    Decrement RemainingTime(|) by RemainingTime(MinJobSlot)
    If (RemainingTime(|) == 0) {
        Let testcase T = the testcase in job slot |
        increment Runs(T)
    }
}
Execute any user specified weighting algorithm if enough simulated time has passed since last weighting algorithm for each test T, calculate simulation statistics as follows:
    Expected number of cycles executed = Runs(T) * AvgCycles(T)
    Expected duration (seconds) = Runs(T) * AvgDuration(T)
    Expected number of unique coverage event hit events = Sum(CoverageEventHit(i, T), over all coverage events | ),
        where CoverageEvent(I, T) = 1 if C(I, T) * Runs(T) >= 1, 0 otherwise Stop BatchSimulation if any user specified simulation target is reached
}

*FIG. 4*

HARDWARE VERIFICATION BATCH COMPUTING FARM SIMULATOR

BACKGROUND OF THE INVENTION

1. Field of the Invention

The present invention relates generally to an improved data processing system. More specifically, the present invention is directed to a computer implemented method, system, and computer usable program code for calculating the expected behavior of a group of hardware verification test cases when executed in a batch computing environment.

2. Description of the Related Art

Today, computer systems have evolved into extremely sophisticated devices that may be found in many different settings. Typically, computer systems include a combination of hardware components, such as, for example, semiconductors, circuit boards, disk drives, peripheral devices, and the like, and software components, such as, for example, computer programs and applications. The combination of hardware and software components on a particular computer system defines the computing environment.

As advances in semiconductor processing and computer architecture continue to push rapidly the performance of computer hardware higher, more sophisticated computer software programs and applications have evolved to test diagnostically these sophisticated hardware designs. These tests are run on a group of processors known as a simulation farm. Such a farm could potentially comprise thousands of processors. The test cases are analyzed using the simulation farm, which is referred to as batch processing.

However, current testing programs run every available test case to verify hardware designs. Running every available test case to verify a hardware design has a high cost in terms of the amount of resources used. This high cost is especially true with regard to processor overhead.

SUMMARY OF THE INVENTION

The exemplary embodiments provide a computer implemented method, apparatus, and computer usable program code for calculating the expected behavior of a group of hardware verification test cases. Batch simulation parameters are configured. A test case is submitted for evaluation. Historical performance data for test cases associated with the submitted test case is gathered. A set of performance statistics for the submitted test case is generated based on the historical performance data and the configured batch simulation parameters. A set of values for the submitted test is generated based on the generated performance statistics for the submitted test case and the historical performance data. The generated set of values and the generated set of performance statistics for the submitted test case are displayed to a user.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIG. 4 is an example of a script for calculating the expected behavior of a group of hardware verification test cases when executed in batch computing environment in accordance with an exemplary embodiment;

DETAILED DESCRIPTION OF THE PREFERRED EMBODIMENT

Figure 1:
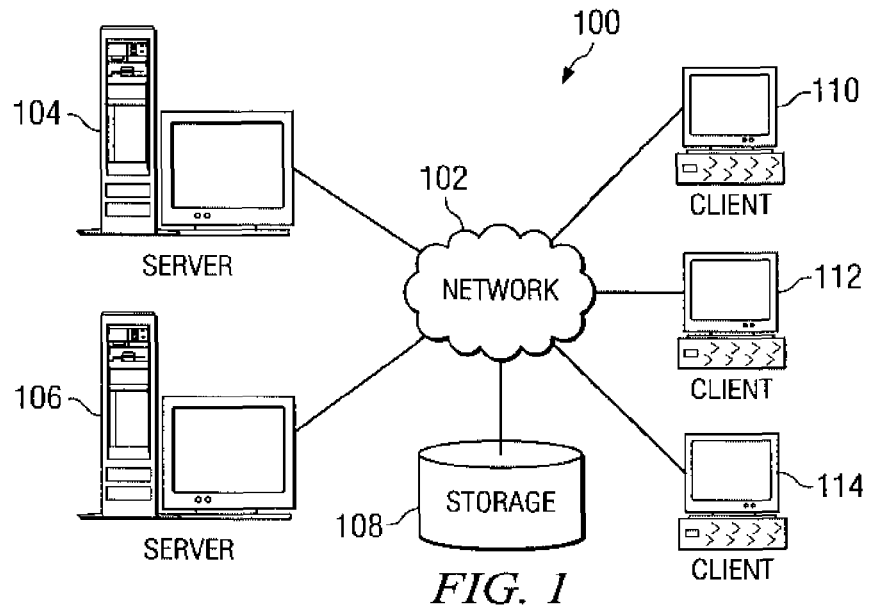
FIG. 1 is a pictorial representation of a network of data processing systems in which illustrative embodiments may be implemented.
Figure 2:
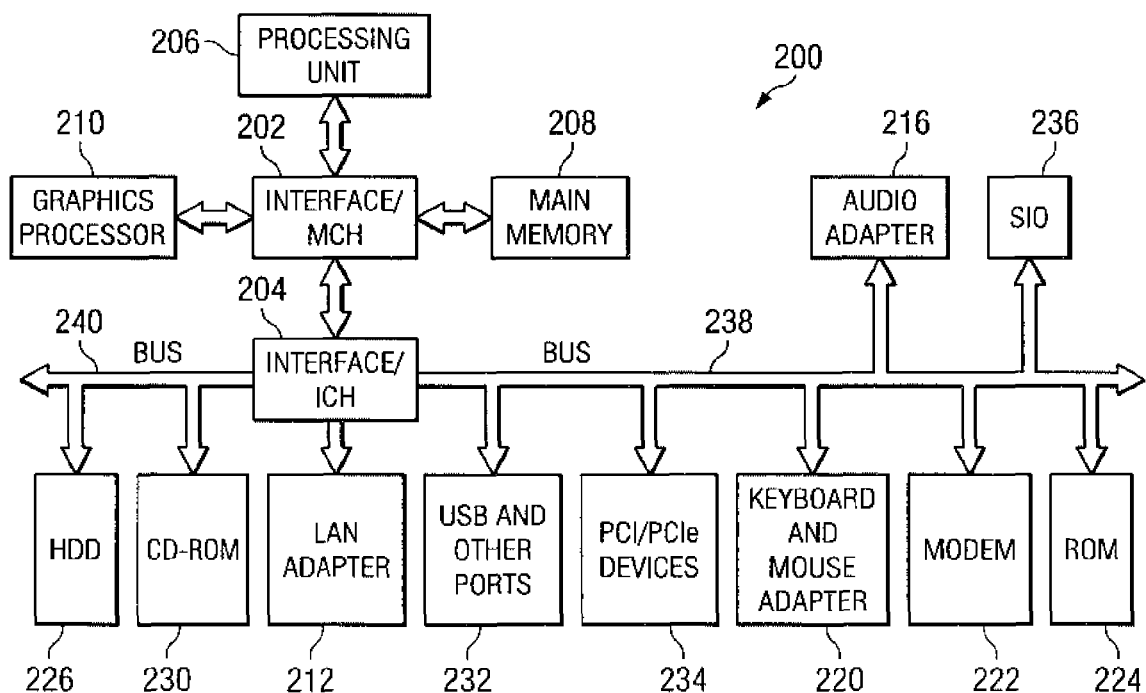
FIG. 2 is a block diagram of a data processing system in which illustrative embodiments may be implemented.

With reference now to the figures and in particular with reference to FIGS. 1-2, exemplary diagrams of data processing environments are provided in which illustrative embodiments may be implemented. It should be appreciated that FIGS. 1-2 are only exemplary and are not intended to assert or imply any limitation with regard to the environments in which different embodiments may be implemented. Many modifications to the depicted environments may be made.

FIG. 1 depicts a pictorial representation of a network of data processing systems in which illustrative embodiments may be implemented. Network data processing system 100 is a network of computers in which the illustrative embodiments may be implemented. Network data processing system 100 contains network 102, which is the medium used to provide communications links between various devices and computers connected together within network data processing system 100. Network 102 may include connections, such as wire, wireless communication links, or fiber optic cables.

In the depicted example, server 104 and server 106 connect to network 102 along with storage unit 108. In addition, clients 110, 112, and 114 connect to network 102. Clients 110, 112, and 114 may be, for example, personal computers or network computers. In the depicted example, server 104 provides data, such as boot files, operating system images, and applications to clients 110, 112, and 114. Clients 110, 112, and 114 are clients to server 104 in this example. Network data processing system 100 may include additional servers, clients, and other devices not shown.

In the depicted example, network data processing system 100 is the Internet with network 102 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers, consisting of thousands of commercial, governmental, educational and other computer systems that route data and messages. Of course, network data processing system 100 also may be implemented as a number of different types of networks, such as for example, an intranet, a local area network (LAN), or a wide area network (WAN). FIG. 1 is intended as an example, and not as an architectural limitation for the different illustrative embodiments.

With reference now to FIG. 2, a block diagram of a data processing system is shown in which illustrative embodiments may be implemented. Data processing system 200 is an example of a computer, such as server 104 or client 110 in FIG. 1, in which computer usable program code or instructions implementing the processes may be located for the illustrative embodiments.

In the depicted example, data processing system 200 employs a hub architecture including interface and memory controller hub (interface/MCH) 202 and interface and input/output (I/O) controller hub (interface/ICH) 204. Processing unit 206, main memory 208, and graphics processor 210 are coupled to interface and memory controller hub 202. Processing unit 206 may contain one or more processors and even may be implemented using one or more heterogeneous processor systems. Graphics processor 210 may be coupled to the interface/MCH through an accelerated graphics port (AGP), for example.

In the depicted example, local area network (LAN) adapter 212 is coupled to interface and I/O controller hub 204 and audio adapter 216, keyboard and mouse adapter 220, modem 222, read only memory (ROM) 224, universal serial bus (USB) and other ports 232, and PCI/PCIe devices 234 are coupled to interface and I/O controller hub 204 through bus 238, and hard disk drive (HDD) 226 and CD-ROM 230 are coupled to interface and I/O controller hub 204 through bus 240. PCI/PCIe devices may include, for example, Ethernet adapters, add-in cards, and PC cards for notebook computers. PCI uses a card bus controller, while PCIe does not. ROM 224 may be, for example, a flash binary input/output system (BIOS). Hard disk drive 226 and CD-ROM 230 may use, for example, an integrated drive electronics (IDE) or serial advanced technology attachment (SATA) interface. A super I/O (SIO) device 236 may be coupled to interface and I/O controller hub 204.

An operating system runs on processing unit 206 and coordinates and provides control of various components within data processing system 200 in FIG. 2. The operating system may be a commercially available operating system such as Microsoft® Windows Vista™ (Microsoft and windows Vista are trademarks of Microsoft Corporation in the United States, other countries, or both). An object oriented programming system, such as the Java™ programming system, may run in conjunction with the operating system and provides calls to the operating system from Java™ programs or applications executing on data processing system 200. Java™ and all Java™-based trademarks are trademarks of Sun Microsystems, Inc. in the United States, other countries, or both.

Instructions for the operating system, the object-oriented programming system, and applications or programs are located on storage devices, such as hard disk drive 226, and may be loaded into main memory 208 for execution by processing unit 206. The processes of the illustrative embodiments may be performed by processing unit 206 using computer implemented instructions, which may be located in a memory such as, for example, main memory 208, read only memory 224, or in one or more peripheral devices.

The hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. Also, the processes of the illustrative embodiments may be applied to a multiprocessor data processing system.

In some illustrative examples, data processing system 200 may be a personal digital assistant (PDA), which is generally configured with flash memory to provide non-volatile memory for storing operating system files and/or user-generated data. A bus system may be comprised of one or more buses, such as a system bus, an I/O bus and a PCI bus. Of course, the bus system may be implemented using any type of communications fabric or architecture that provides for a transfer of data between different components or devices attached to the fabric or architecture. A communications unit may include one or more devices used to transmit and receive data, such as a modem or a network adapter. A memory may be, for example, main memory 208 or a cache such as found in interface and memory controller hub 202. A processing unit may include one or more processors or CPUs. The depicted examples in FIGS. 1-2 and above-described examples are not meant to imply architectural limitations. For example, data processing system 200 also may be a tablet computer, laptop computer, or telephone device in addition to taking the form of a PDA.

Exemplary embodiments provide a computer implemented method, system, and computer usable program code for calculating the expected behavior of a group of hardware verification test cases when executed in a batch computing environment. Currently there is no way to know what changing the parameters of the batch processing will do in terms of performance of a simulation farm. Exemplary embodiments allow for capacity planning, coverage planning, and weighting algorithm tests for a simulation farm by simulating or predicting the performance of the simulation farm based on historical data of actual test cases. A weighting algorithm dynamically changes the test case weights as the simulation progresses. Exemplary embodiments allow a user to apply a weighting algorithm periodically during the execution of the simulation.

Given an existing body of test cases, exemplary embodiments provide for determining a test case weighting or duration/job slots/cycles value that is required to meet a duration/job slots/cycles target. The number of job slots is the number of test cases that can be evaluated in parallel by the simulated farm. A job slots target is the desired number of parallel test case evaluations available to perform in the simulated farm.

Each test case is assigned a positive integer called a weight. Therefore, each test case has an individual test case weight. Exemplary embodiments allow for altering this individual test case weight for each individual test case.

A duration value is an actual number of virtual seconds the simulation ran before termination. A duration target is a desired number of virtual seconds the simulation is allowed to run before termination. A cycles value is an actual number of total virtual cycles the simulation executed before termination. A cycles target is a desired number of total virtual cycles the simulation should be allowed to execute before termination.

Exemplary embodiments analyze past performance and coverage statistics of a simulation farm. Based on these statistics, exemplary embodiments calculate changes that need to be made to the simulation farm settings in order to achieve new performance goals. For example, if a user wants to analyze the test case in a decreased amount of time, exemplary embodiments determine what other performance parameters need to be changed in order to meet the goal.

Exemplary embodiments also calculate the effects of changing a test case weighting or time/job slots/cycles value in order to provide for coverage planning. That is, for example, if a user wanted to change the time value for performing a test case, exemplary embodiments analyze past performance and indicate the results of altering the time value in terms of the other performance parameters of the simulation farm.

Additionally, based on past performance data, exemplary embodiments provide for evaluating the likely performance of an automated test case weighting scheme in the simulation farm. Exemplary embodiments provide all of these functions without spending actual batch computing resources, thus saving time and expense.

Figure 3:
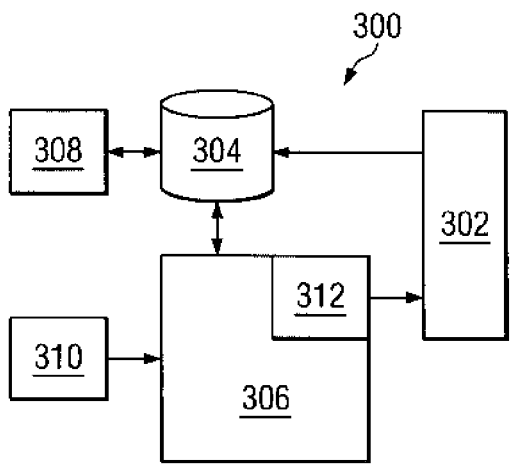
FIG. 3 is a block diagram illustrating a system for calculating the expected behavior of a group of hardware verification test cases when executed in a batch computing environment in accordance with an exemplary embodiment.

Turning back to the figures, FIG. 3 is a block diagram illustrating a system for calculating the expected behavior of a group of hardware verification test cases when executed in a batch computing environment in accordance with an exemplary embodiment. System 300 may be implemented in network data processing system 100 in FIG. 1. System 300 is a plurality of hardware and software components coupled together for calculating the expected behavior of a group of hardware verification test cases when executed in a batch computing environment.

In the depicted example, system 300 comprises simulation farm 302, results database 304, data processing system 306, batch simulator tool 308, test case submitter 310, and data collector 312. Data processing system 306, batch simulator tool 308, and test case submitter 310 may be implemented in a data processing system such as data processing system 200 in FIG. 2. Simulation farm 302 may be implemented as a group or network, such as network data processing system 100 in FIG. 1, of data processing systems, such as data processing system 200 of FIG. 2.

It should be noted that system 300 is only shown for exemplary purposes and is not meant as an architectural limitation to illustrative embodiments. In other words, system 300 may include more or fewer components as necessary to perform processes of various exemplary embodiments. Furthermore, various components of system 300 may be implemented in configurations other than shown.

For example, test case submitter 310 and batch simulator tool 308 are depicted as a separate components and are implemented in separate data processing systems. Alternately, test case submitter 310 and/or batch simulator tool 308 may implemented as part of data processing system 306. Another example is results database 304. In the present example, results database 304 is depicted individually. However, in various alternate embodiments, results database 304 may be implemented as part of data processing system 306, or results database 304 may be implemented in a separate data processing system. Furthermore, while results database 304 is described as storing data from both simulation farm 302 and data collector 312, the results from these components may be stored in multiple databases.

Simulation farm 302 provides the initial data processing capabilities for test case submitter 310. System 300 utilizes simulation farm 302 to test a software model of a hardware design that is submitted via test case submitter 310. A user submits test cases to data processing system 306 via test case submitter 310. Simulation farm 302 performs the hardware verification test case. The results of these tests are stored in results database 304.

Results database 304 may be implemented on a non-volatile storage device that may, for example, be configured as read only memory (ROM) and/or flash ROM to provide the non-volatile memory for storing applications and/or generated data.

Results database 304 comprises the results of each hardware verification test case as well as historical performance statistics for each hardware verification test case. Results database 304 may be implemented as a relational database. Data collector 312 queries database results 304 to collect simulation performance and coverage statistics for every simulation test case.

Data collector 312 comprises a series of scripts that run as a simulation postprocessor. The scripts can be written in any language that can process text files, such as, but not limited to, PERL (Practical Extraction and Reporting Language), Java™, KSH (Korn shell), and so forth. The scripts parse various output files, collecting identifying information, such as a project identifier, category information, test type, test case identifier; job information, such as elapsed simulation time and elapsed generation time; simulation runtime statistics, such as cycles simulated and hardware model; and a count of every monitored coverage event encountered during the course of the job. A coverage event is a tracked event during hardware verification test cases. At the end of every simulation, job data collector 312 stores the data in results database 304.

Batch simulator tool 308 queries results database 304 to compile historical performance statistics for each hardware verification test case. Batch simulator tool 308 then uses this data to quickly compute the most likely simulation statistics that would result if the test cases were executed under different configurations of a similar batch computing environment.

At the end of every simulation job, data collector 312 manipulates the data into a format suitable for storage in results database 304, which is implemented as a relational database.

Batch simulator tool 308 gathers historical performance data for all test cases recently executed by the batch computing environment, simulation farm 302, from results database 304. Under the assumption that this historical data is a predictor of future performance, batch simulator tool 308 calculates the values of various test case performance statistics, such as, for example, batch cycles, coverage, total duration, and so forth, that are most likely to arise from a future batch execution of a weighted subgroup of test cases in a hypothetical batch farm. This calculation is termed the "Batch Simulation."

Batch simulator tool 308 allows users to configure a number of Batch Simulation parameters including the number of job slots, individual test case weights, simulation duration, cycles target, coverage target, and a weighting algorithm. A coverage target is the number of unique coverage events that must be encountered, or hit, before Batch Simulation is halted.

During Batch Simulation, a test case is selected for execution with a probability defined by the test case's individual test case weight divided by the sum of all weights of all test cases. The user can choose to apply a weighting algorithm periodically during the execution of the Batch Simulation. The weighting algorithm can dynamically change the test case weights as the Batch Simulation progresses.

Once Batch Simulation is complete, batch simulator tool 308 generates the following for every test case: (i) simulated test case run count; (ii) expected number of cycles executed; (iii) expected duration, usually expressed in seconds; and (iv) the number of unique coverage events expected and their frequency.

Additionally, batch simulator tool 308 generates the following output for every coverage event; (i) a list of test cases that hit the coverage event during the course of the simulation, and (ii) a list of test cases that have a nonzero chance of hitting the coverage event.

Batch simulator tool 308 also calculates, for each test case, several additional values. Batch simulator tool 308 calculates the average amount of time, usually expressed in seconds, jobs running the test case took to complete the simulation. This value is derived from historical performance data. Batch simulator tool 308 also calculates the average number of simulation cycles achieved by jobs running the test case. This value is derived from historical performance data.

Batch simulator tool 308 also calculates the number of times a coverage event should occur, divided by the number of times a job running the test case executed, defined over all coverage events. This value is derived from historical performance data.

Batch simulator tool 308 counts the number of times that a particular test case ran in a Batch Simulation. This value is initialized to zero. Batch simulator tool 308 calculates the remaining amount of time a job in a job slot will execute.

FIG. 4 is an example of a script for calculating the expected behavior of a group of hardware verification test cases when executed in batch computing environment in accordance with an exemplary embodiment. The BatchSimulation Algorithm script begins by setting simulated time to zero as indicated by "Set SimulatedTime to 0:." Next, a repeating loop is presented, as indicated by "Repeat { }." Thus, everything between the brackets "{ }" is repeated until a stop condition is met. The stop condition listed at the last line of the repeating loop is "Stop BatchSimulation if any user specified simulation target is reached."

The script in the repeating loop proceeds by stating that "For all empty job slots j { }" perform the statements between the brackets "{ }." The statements between the brackets "{ }" that are to be performed during each iteration of the loop for all empty job slots j are "Randomly select a test case T based on weight distribution over all test cases. Assign test case T to job slot j. The test is considered "running." Set RemainingTime(j) to AvgDuration(T)." AvgDuration(T) is the average amount of time, usually expressed in seconds, jobs running the test case took to complete the simulation. This value is derived from historical performance data. The repeating loop continues by stating "Select jobslot MinJobSlot such that RemainingTime(MinJobSlot) is a minimum. Advance SimulatedTime by RemainingTime (MinJobSlot)."

And then "For all job slots j { }" perform the statements between the brackets "{ }." The statements between the brackets "{ }" that are to be performed during each iteration of the loop for all job slots j is to "Decrement RemainingTime (j) by RemainingTime(MinJobSlot)." and "If (RemainingTime(j)==0) { }" perform commands between the brackets "{ }." The statements between the brackets "{ }" that are to be performed if (RemainingTime(j)==0) are "Let test case T=the test case in job slot j;" and "increment Runs (T)."

The repeating loop continues by stating "Execute any user specified weighting algorithm if enough simulated time has passed since last weighting algorithm." Then "for each test T, calculate simulation statistics as follows: Expected number of cycles executed=Runs(T)*AvgCycles(T); Expected duration (seconds)=Runs(T)*AvgDuration(T); Expected number of unique coverage event hit events=Sum(CoverageEvent(i, T), over all coverage events i), where CoverageEvent(i, T)=1 if C(i, T)*Runs(T)>=1, 0 otherwise. Stop Batchsimulation if any user specified simulation target is reached." C(i, T) stands for the ratio of the number of times a job running test case T hit the coverage event i to the number of times all jobs running test case T executed, defined over all coverage events. It should be noted that the script presented in FIG. 4 is merely an exemplary script and is presented for explanatory purposes only. The script presented in FIG. 4 is in no way intended to limit exemplary embodiments to the specific script shown. Those of ordinary skill in the art will recognize many other ways to write such a script depending on the specific implementation intended, including other calculations, omitting calculations, and so forth.

Further, while the above script is presented in the Pseudo language, scripts may be written in any appropriate language that supports processing of text files, such as for example, but not limited to, PERL, Java™ and so forth.

Figure 5:
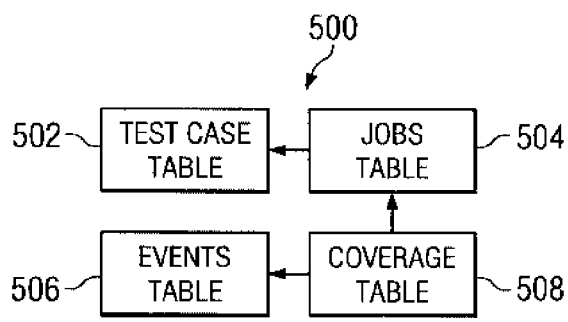
FIG. 5 is a block diagram illustrating tables for storing test case information in accordance with an exemplary embodiment.

FIG. 5 is a block diagram illustrating tables for storing test case information in accordance with an exemplary embodiment. System 500 is a set of tables for storing test case information. In an exemplary embodiment, system 500 is implemented in a relational database, such as results database 304 in FIG. 3. In exemplary embodiments, information that is common to every execution of a job's test case, for example, categorization data like project, test case type, and so forth, is stored in test case table 502. A separate table, jobs table 504, holds job specific data like simulation runtime statistics, a job timestamp, a simulation machine identifier, and a reference to the appropriate entry in test case table 502. A third table, events table 506, lists the names of all coverage events in the design as well as any other event identifying information. The final table, coverage table 508, contains a list of pairs of event table references and counts that indicate how often the particular job hit, or encountered, each coverage event, as well as a reference to the appropriate job in jobs table 504.

Figure 6:
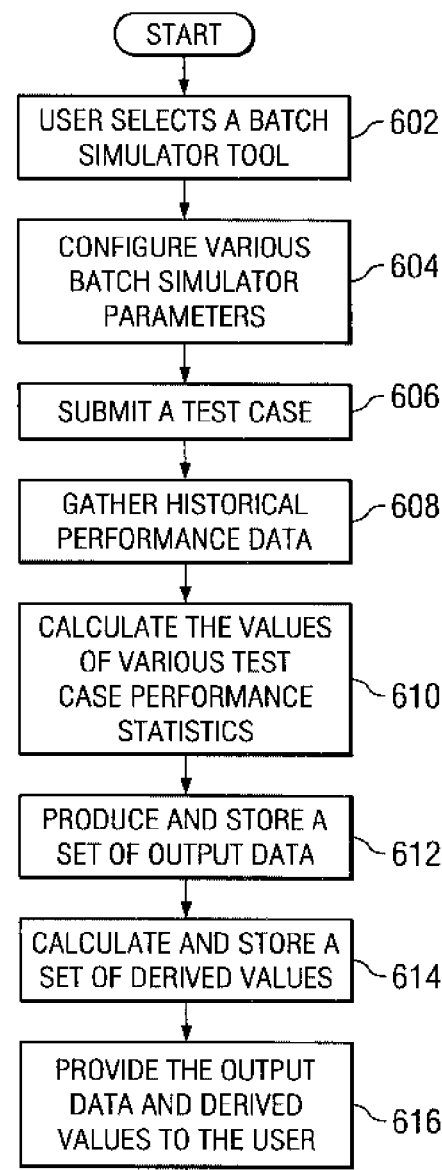
FIG. 6 is a flowchart illustrating the process of calculating the expected behavior of a group of hardware verification test cases when executed in a batch computing environment in accordance with an exemplary embodiment.

With reference now to FIG. 6, a flowchart illustrating the process of calculating the expected behavior of a group of hardware verification test cases when executed in a batch computing environment in accordance with an exemplary embodiment. The process shown in FIG. 6 may be implemented in a system such as system 300 in FIG. 3.

The process begins when a user selects a batch simulator tool, such as batch simulator tool 308 in FIG. 3 (step 602). The user uses the batch simulator tool to configure various batch simulation parameters (step 604). Such parameters include, but are not limited to, the number of job slots, individual test case weights, simulation duration, cycles target, coverage target, and a weighting algorithm.

The user then submits a test case for evaluation to the batch simulator tool via a submitter, such as test case submitter 310 in FIG. 3 (step 606). The batch simulator tool than gathers historical performance data for all test cases recently executed by a simulation farm, such as simulation farm 302 in FIG. 3 (step 608). This information is gathered by a data collection tool, such as data collection 312 in FIG. 3 from a database, such as results database 304 in FIG. 3. The data collection tool stores the information, on a test case granularity, in a relational database. The batch simulator tool then accesses this information in the relational database to perform its calculations.

The batch simulator tool calculates the values of various test case performance statistics (step 610). The batch simulator tool then produces and stores a set of output data (step 612). Then the batch simulator tool calculates and stores a set of derived values (step 614). The batch simulator tool then provides the output data and the derived values to the user (step 616) and the operation ends. The output data and the derived values may be provided to a user in a variety of ways, such as, for example, but not limited to, displaying, a print out, stored on a computer readable medium, and so forth.

Thus, exemplary embodiments provide for calculating the expected behavior of a group of hardware verification test cases when executed in batch computing environment. Exemplary embodiments allow for capacity planning, coverage planning, and weighting algorithm tests for a simulation farm by simulating or predicting the performance of the simulation farm based on historical data of actual test cases. Exemplary embodiments allow a user to apply a weighting algorithm periodically during the execution of the simulation.

The invention may take the form of an entirely hardware embodiment, an entirely software embodiment, or an embodiment containing both hardware and software elements. In a preferred embodiment, the invention is implemented in software, which includes but is not limited to firmware, resident software, microcode, etc.

Furthermore, the invention may take the form of a computer program product accessible from a computer-usable or computer-readable medium providing program code for use by or in connection with a computer or any instruction execution system. For the purposes of this description, a computer-usable or computer-readable medium may be any tangible apparatus that may contain, store, communicate, propagate, or transport the program for use by or in connection with the instruction execution system, apparatus, or device.

The medium may be an electronic, magnetic, optical, electromagnetic, infrared, or semiconductor system (or apparatus or device) or a propagation medium. Examples of a computer-readable medium include a semiconductor or solid-state memory, magnetic tape, a removable computer diskette, a random access memory (RAM), a ROM, a rigid magnetic disk, and an optical disk. Current examples of optical disks include compact disk—read only memory (CD-ROM), compact disk—read/write (CD-R/W), and DVD.

A data processing system suitable for storing and/or executing program code will include at least one processor coupled directly or indirectly to memory elements through a system bus. The memory elements may include local memory employed during actual execution of the program code, bulk storage, and cache memories, which provide temporary storage of at least some program code in order to reduce the number of times code must be retrieved from bulk storage during execution.

Input/output or I/O devices (including but not limited to keyboards, displays, pointing devices, et cetera) may be coupled to the system either directly or through intervening I/O controllers.

Network adapters also may be coupled to the system to enable the data processing system to become coupled to other data processing systems, remote printers, or storage devices through intervening private or public networks. Modems, cable modems, and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A computer implemented method for calculating the expected behavior of a group of hardware verification test cases, the computer implemented method comprising:
   configuring batch simulation parameters;
   submitting a test case for evaluation;
   gathering historical performance data for test cases associated with the submitted test case;
   generating a set of performance statistics for the submitted test case based on the historical performance data and the configured batch simulation parameters;
   generating a set of values for the submitted test case based on the generated performance statistics for the submitted test case and the historical performance data; and
   providing the generated set of values and the generated set of performance statistics for the submitted test case to a user, wherein generating the set of performance statistics comprises:
   generating a simulated test case run count;
   generating an expected number of cycles executed;
   generating an expected duration,
   generating a number of unique coverage events expected; and
   generating a frequency of occurrence of unique coverage events.

2. The computer implemented method of claim 1, wherein generating the set of performance statistics further comprises:
   generating, for each unique coverage event,:
   a list of test cases that hit the coverage event during the course of the simulation; and
   a list of test cases that have a nonzero chance of hitting the coverage event.

3. A computer implemented method for calculating the expected behavior of a group of hardware verification test cases, the computer implemented method comprising:
   configuring batch simulation parameters;
   submitting a test case for evaluation;
   gathering historical performance data for previously executed test cases associated with the submitted test case;
   generating a set of performance statistics for the submitted test case based on the historical performance data and the configured batch simulation parameters;
   generating a set of values for the submitted test case based on the generated set of performance statistics for the submitted test case and the historical performance data;
   providing the generated set of values and the generated set of performance statistics for the submitted test case to a user;
   storing the historical performance data on a test case granularity; and
   accessing the stored historical performance data and calculating values of various test case performance statistics based on the stored historical performance data, wherein the historical performance data is stored in a relational database, wherein the relational database comprises:
   a first table for storing categorization data;
   a second table for storing job related data, wherein each entry in the second table corresponds to an entry in the first table;
   a third table for storing event information; and
   a fourth table for storing coverage information, wherein each entry in the fourth table is associated with an entry in the third table and an entry in the second table.

4. A computer implemented method for calculating the expected behavior of a group of hardware verification test cases, the computer implemented method comprising:
   configuring batch simulation parameters;
   submitting a test case for evaluation;
   gathering historical performance data for previously executed test cases associated with the submitted test case;
   generating a set of performance statistics for the submitted test case based on the historical performance data and the configured batch simulation parameters;
   generating a set of values for the submitted test case based on the generated set of performance statistics for the submitted test case and the historical performance data; and providing the generated set of values and the generated set of performance statistics for the submitted test case to a user, wherein generating the set of values comprises:
  generating an average amount of time that jobs running the submitted test case took to complete;
  generating an average number of simulation cycles achieved by jobs running the submitted test case;
  generating a number of times that the submitted test case ran;
  generating a remaining amount of time that a job in a particular job slot will execute; and
  generating for each unique coverage event, a ratio of a number of times that a job running the submitted test case hit a unique coverage event to a number times a job running the submitted test case executed.

5. A computer program product comprising:
a computer usable storage medium having computer usable program code for calculating the expected behavior of a group of hardware verification test cases, the computer program product comprising:
computer usable program code for configuring batch simulation parameters;
computer usable program code for submitting a test case for evaluation;
computer usable program code for gathering historical performance data for test cases associated with the submitted test case;
computer usable program code for generating a set of performance statistics for the submitted test case based on the historical performance data and the configured batch simulation parameters;
computer usable program code for generating a set of values for the submitted test case based on the generated performance statistics for the submitted test case and the historical performance data; and
computer usable program code for providing the generated set of values and the generated set of performance statistics for the submitted test case to a user, wherein the computer usable program code for generating the set of performance statistics comprises:
computer usable program code for generating a simulated test case run count;
computer usable program code for generating an expected number of cycles executed;
computer usable program code for generating an expected duration,
computer usable program code for generating a number of unique coverage events expected; and
computer usable program code for generating a frequency of occurrence of unique coverage events.

6. The computer program product of claim 5, wherein the computer usable program code for generating the set of performance statistics further comprises:
computer usable program code for generating, for each unique coverage event,:
  a list of test cases that hit the coverage event during the course of the simulation; and
  a list of test cases that have a nonzero chance of hitting the coverage event.

7. A computer program product comprising:
a computer usable storage medium having computer usable program code for calculating the expected behavior of a group of hardware verification test cases, the computer program product comprising:
computer usable program code for configuring batch simulation parameters;
computer usable program code for submitting a test case for evaluation;
computer usable program code for gathering historical performance data for previously executed test cases associated with the submitted test case;
computer usable program code for generating a set of performance statistics for the submitted test case based on the historical performance data and the configured batch simulation parameters;
computer usable program code for generating a set of values for the submitted test case based on the generated set of performance statistics for the submitted test case and the historical performance data;
computer usable program code for providing the generated set of values and the generated set of performance statistics for the submitted test case to a user;
computer usable program code for storing the historical performance data on a test case granularity; and
computer usable program code for accessing the stored historical performance data and calculating values of various test case performance statistics based on the stored historical performance data, wherein the historical performance data is stored in a relational database, wherein the relational database comprises:
  a first table for storing categorization data;
  a second table for storing job related data, wherein each entry in the second table corresponds to an entry in the first table;
  a third table for storing event information; and
  a fourth table for storing coverage information, wherein each entry in the fourth table is associated with an entry in the third table and an entry in the second table.

8. A computer program product comprising:
a computer usable storage medium having computer usable program code for calculating the expected behavior of a group of hardware verification test cases, the computer program product comprising:
computer usable program code for configuring batch simulation parameters;
computer usable program code for submitting a test case for evaluation;
computer usable program code for gathering historical performance data for previously executed test cases associated with the submitted test case;
computer usable program code for generating a set of performance statistics for the submitted test case based on the historical performance data and the configured batch simulation parameters;
computer usable program code for generating a set of values for the submitted test case based on the generated set of performance statistics for the submitted test case and the historical performance data; and
computer usable program code for providing the generated set of values and the generated set of performance statistics for the submitted test case to a user, wherein the computer usable program code for generating the set of values comprises:
  computer usable program code for generating an average amount of time that jobs running the submitted test case took to complete;
  computer usable program code for generating an average number of simulation cycles achieved by jobs running the submitted test case;
  computer usable program code for generating a number of times that the submitted test case ran;

computer usable program code for generating a remaining amount of time that a job in a particular job slot will execute; and computer usable program code for generating for each unique coverage event, a ratio of a number of times that a job running the submitted test case hit a unique coverage event to a number times a job running the submitted test case executed.

9. A data processing system for calculating the expected behavior of a group of hardware verification test cases, the data processing system comprising:

a bus;

a communications unit connected to the bus;

a storage device connected to the bus, wherein the storage device includes computer usable program code; and a processor unit connected to the bus, wherein the processor unit executes the computer usable program code to configure batch simulation parameters; submit a test case for evaluation; gather historical performance data for test cases associated with the submitted test case; generate a set of performance statistics for the submitted test case based on the historical performance data and the configured batch simulation parameters; generate a set of values for the submitted test case based on the generated performance statistics for the submitted test case and the historical performance data; and provide the generated set of values and the generated set of performance statistics for the submitted test case to a user, wherein the processor executing computer usable program code to generate the set of performance statistics comprises:

the processor executing computer usable program code to generate a simulated test case run count; generate an expected number of cycles executed; generate an expected duration, to generate a number of unique coverage events expected; and generate a frequency of occurrence of unique coverage events.

* * * * *